United States Patent
Podell et al.

(10) Patent No.: US 10,818,996 B1
(45) Date of Patent: Oct. 27, 2020

(54) INDUCTIVE RADIO FREQUENCY POWER SAMPLER

(71) Applicant: Werlatone, Inc., Brewster, NY (US)

(72) Inventors: Allen F. Podell, Palo Alto, CA (US); Philip M. Robertson, New Milford, CT (US); Carl G. Schuster, New Milford, CT (US); Bernard J. Werlau, Brewster, NY (US); Ky-Hien Do, Mississauga (CA)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 16/599,028

(22) Filed: Oct. 10, 2019

(51) Int. Cl.
| | |
|---|---|
| H01P 5/10 | (2006.01) |
| H03H 7/42 | (2006.01) |
| H03H 11/32 | (2006.01) |
| H03H 7/38 | (2006.01) |
| H03F 3/189 | (2006.01) |
| H01F 19/04 | (2006.01) |

(52) U.S. Cl.
CPC ............ H01P 5/10 (2013.01); H01F 19/04 (2013.01); H03F 3/189 (2013.01); H03H 7/38 (2013.01); H03H 11/32 (2013.01); H03F 2200/09 (2013.01); H03F 2200/451 (2013.01); H03F 2203/45 (2013.01)

(58) Field of Classification Search
CPC ............ H01P 5/10; H03H 7/42; H03H 7/422
USPC ................................................ 333/25, 24 R
See application file for complete search history.

(56) References Cited

U.S. PATENT DOCUMENTS

| | | |
|---|---|---|
| 3,103,638 A | 9/1963 | Greuet |
| 3,237,130 A | 2/1966 | Cohn |
| 3,370,257 A | 2/1968 | Spierling |
| 3,428,886 A | 2/1969 | Masao Kawashima et al. |
| 3,614,676 A | 10/1971 | Boelke |
| 4,222,016 A | 9/1980 | Stock et al. |
| 4,554,518 A | 11/1985 | Baer |
| 4,825,220 A | 4/1989 | Edward et al. |
| 5,008,639 A | 4/1991 | Pavio |
| 5,121,090 A | 6/1992 | Garuts et al. |
| 5,296,823 A | 3/1994 | Dietrich |
| 5,304,959 A | 4/1994 | Wisherd et al. |

(Continued)

OTHER PUBLICATIONS

Monteath, Coupled Transmission Lines as Symmetrical Directional Couplers, Proc. IEE, vol. 102, Part B, No. 3, pp. 383 through 392, May 1955, 10 pages.

(Continued)

Primary Examiner — Dean O Takaoka
(74) Attorney, Agent, or Firm — Kolisch Hartwell, P.C.

(57) ABSTRACT

A power sampler may include a sampling circuit interposed in one leg of a differential-signal circuit. An input balun may convert a single-ended signal from a signal source into a differential signal on first and second differential-signal input ports. An output balun may convert an output differential signal to a single-ended output signal to a signal load. The sampling circuit may include an inductance and a coupling circuit. The inductance may be an inductor and have an impedance higher than a source impedance. The coupling circuit, which may be a balun, is connected to the inductance and outputs a single-ended sample signal having a magnitude proportional to the inductance impedance at the design frequency. A second coupling-circuit output conducts an output differential signal and may be connected to the output balun.

20 Claims, 6 Drawing Sheets

(56) References Cited

U.S. PATENT DOCUMENTS

| | | | | |
|---|---|---|---|---|
| 5,534,830 | A | * | 7/1996 | Ralph ................. H01F 17/0006 333/117 |
| 5,697,088 | A | | 12/1997 | Gu |
| 5,745,017 | A | * | 4/1998 | Ralph ................. H01F 17/0006 329/354 |
| 5,889,444 | A | | 3/1999 | Johnson et al. |
| 5,977,842 | A | | 11/1999 | Brown et al. |
| 5,982,252 | A | | 11/1999 | Werlau |
| 6,130,588 | A | | 10/2000 | Gallivan et al. |
| 6,150,897 | A | | 11/2000 | Nishikawa et al. |
| 6,263,198 | B1 | * | 7/2001 | Li ........................ H03D 9/0633 455/327 |
| 6,285,273 | B1 | | 9/2001 | Morikawa |
| 6,294,965 | B1 | | 9/2001 | Merrill et al. |
| 6,750,752 | B2 | | 6/2004 | Werlau |
| 6,914,512 | B2 | | 7/2005 | Park et al. |
| 6,982,609 | B1 | | 1/2006 | McKay et al. |
| 7,068,122 | B2 | | 6/2006 | Weng et al. |
| 7,274,267 | B2 | | 9/2007 | Saitou et al. |
| 7,324,796 | B2 | * | 1/2008 | Ji ........................ H03D 9/0633 327/208 |
| 7,692,512 | B2 | | 4/2010 | Podell |
| 7,839,232 | B2 | | 11/2010 | London |
| 8,248,180 | B2 | | 8/2012 | Podell |
| 9,502,746 | B2 | * | 11/2016 | Fasenfest ................. H01P 5/12 |
| 2007/0159268 | A1 | * | 7/2007 | Podell .................... H01P 5/185 333/117 |
| 2011/0074519 | A1 | | 3/2011 | Podell |
| 2015/0341014 | A1 | * | 11/2015 | Wang ....................... H03H 7/42 327/355 |

OTHER PUBLICATIONS

Gerst, Electrically Short 90° Couplers Utilizing Lumped Capacitors, Microwave Symposium Digest, G-MTT International vol. 67, Issue 1, pp. 58 through 62, May 1967, 5 pages.

Russell, Microwave Power Combining Techniques, IEEE Transactions on Microwave Theory and Techniques vol. MTT-27 No. 5, pp. 472 through 478, May 1979, 7 pages.

Illingworth, Definition of the word "balun", The Penguin Dictionary of Electronics, Second Edition, Copyright 1988 Penguin Books, p. 30, 2 pages.

Horowitz, et al., Stubs, baluns, and transformers, The Art of Electronics, Second Edition, Copyright 1989 Cambridge University Press, section 13.10, pp. 881 through 882, 4 pages.

Rogers Corporation, Advanced Circuit Materials, RT/duroid 5870/5880 High Frequency Laminates data sheet, copyright 1989 through 2006 Rogers Corporation, revised Nov. 2006, 2 pages.

Hongming, et al., A 50:1 Bandwidth Cost-Effective Coupler with Sliced Coaxial Cable, IEEE MTT-S Digest, 1996, 4 pages.

Alexanian, Planar and Distributed Spatial Power Combiners, doctoral dissertation, University of California Santa Barbara, Jun. 1997, 119 pages.

Cheng, et al., A 120-W X-Band Spatially Combined Solid-State Amplifier, IEEE Transactions on Microwave Theory and Techniques, vol. 47 No. 12 pp. 2557 through 2561, Dec. 1999, 5 pages.

Microwave Encyclopedia MICROWAVES101.COM, Baluns web page, retrieved from the Internet on Aug. 1, 2007, from http://www.microwavesl01.com/encyclopediaJbaluns.Cfm, updated Nov. 28, 2006, 4 pages.

The Southgate Amateur Radio Club, byline given as G8MNY, Techtip: Coax Balun web page, retrieved from the internet on Aug. 3, 2007, from www.southgatearc.org, 2 pages.

Kim, et al., Ultra-wideband uniplanar MMIC balun using field transformations, Electronics Letters, vol. 42, No. 6, Mar. 16, 2006, 2 pages.

RF and microwave power detection with Schottky diodes, Infineon Technologies AG, Munich, Germany, published Jul. 31, 2018, 15 pages.

M/A-COM, RF Directional Couplers and 3dB Hybrids Overview, Application Note, M/A-COM Division of AMP Incorporated, no date but known to be before Apr. 14, 2005, 10 pages.

\* cited by examiner

INDUCTIVE RADIO FREQUENCY POWER SAMPLER

FIELD

This disclosure relates to radio frequency signal or power samplers. More specifically, the disclosed embodiments relate to inductive circuits for sampling a differential signal or a single-ended signal.

INTRODUCTION

For certain applications, there is a need for a broadband, high power communication system. There may be various reasons for monitoring the radio frequency (RF) signals in such systems. Signal or power samplers are typically non-directional taps for sampling RF signals from a main transmission line, with little effect to the power level of the signals on the main line. For example, a sampled port can be connected to a spectrum analyzer for analysis and measurement, or connected to a low gain, distribution antenna in signal booster systems to augment communications in buildings and tunnels. There are times when it is useful to be able to sample RF signals from a transmitter; such as to provide automatic leveling control (ALC) feedback to a driver, or use signals from a directional coupler to drive power monitors or standing wave ration (SWR) lockout circuits. If all that is needed is to provide forward power monitoring or an ALC signal; a simple way to do this is to use a small capacitor, a probe, or a resistor to tap the transmission line, and feed it to the input of the detector circuit. Such devices, however, have limitations in bandwidths and/or power handling capabilities.

SUMMARY

Power samplers are circuits for sampling or tapping a main signal to produce a sample signal for processing separate from the main signal. In some embodiments, a power sampler may include respective first and second differential-signal input and output ports and a sampling circuit. The first differential-signal input port is configured to receive a first polarity of an input differential signal. The first differential-signal output port is configured to conduct the first polarity of an output differential signal. The first differential-signal input port is connected, directly or indirectly, to the first differential-signal output port. The second differential-signal input port is configured to receive a second polarity of the input differential signal, wherein the second polarity is opposite the first polarity. The second differential-signal output port is configured to conduct the second polarity of the output differential signal.

The sampling circuit may include an inductance and a coupling circuit. The inductance has an inductance input port and an inductance output port. The inductance input port is connected to the second differential-signal input port. The inductance has an inductance impedance at a design frequency of operation for the power sampler. The coupling circuit has input and output ports. The coupling-circuit input port is connected to the inductance output port. A first coupling-circuit output port is coupled to the coupling-circuit input port for outputting a single-ended sample signal having a magnitude proportional to the inductance impedance at the design frequency. A second coupling-circuit output port is connected to the second differential-signal output port and is coupled to the coupling-circuit input port.

In some embodiments, the power sampler may further include an input balun and an output balun. The input balun may be configured to convert a single-ended input signal received on a single-ended-signal input port to the differential input signal on the first and second differential-signal input ports. The output balun may be configured to convert the output differential signal on the first and second differential-signal output ports to a single-ended output signal on a single-ended-signal output port. Additionally or alternatively, the coupling circuit may include a balun configured to convert a differential input signal received on the coupling-circuit input port and the second coupling-circuit output port to the single-ended sample signal on the first coupling-circuit output port.

In some embodiments, a power sampler may include a second sampling circuit that is the same as the first sampling circuit. In this example, the first differential-signal input port is connected to the first differential-signal output port through the second sampling circuit. The inductance input port of the inductance of the second sampling circuit is connected to the first differential-signal input port. The coupling-circuit input port of the coupling circuit of the second sampling circuit is connected to the inductance output port of the inductance of the second sampling circuit. The first coupling-circuit output port of the coupling circuit of the second sampling circuit is coupled to the coupling-circuit input port for outputting a second single-ended sample signal having a magnitude proportional to the inductance impedance of the inductance of the second sampling circuit. The second coupling-circuit output port of the coupling circuit of the second sampling circuit is connected to the first differential-signal output port and coupled to the coupling-circuit input port of the coupling circuit of the second sampling circuit.

Features, functions, and advantages may be achieved independently in various embodiments of the described power samplers, or may be combined in yet other embodiments, further details of which can be seen with reference to the following description and drawings.

DESCRIPTION

Overview

Various embodiments of power samplers having an inductance on a differential signal line are described below and illustrated in the associated drawings. Unless otherwise specified, power samplers and/or various components may, but are not required to, contain at least one of the structure, components, functionality, and/or variations described, illustrated, and/or incorporated herein. Furthermore, the structures, components, functionalities, and/or variations described, illustrated, and/or incorporated herein may, but are not required to, be included in other power detecting devices. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Generally, a power sampler in embodiments described herein may include a sampling circuit positioned in a differential signal line. The sampling circuit includes an inductance and a coupling circuit for producing a sample signal. In some examples, baluns may be used to convert between single-ended and differential signals.

Definitions

Inductance is a circuit or a device possessing inductive reactance. Inductors, transmission lines, and inductive voltage transformers are examples of inductances. Inductance may also refer to a property of an electric circuit by which an electromotive force is induced in it by a variation of current.

An inductor, also called a coil, choke, or reactor, is a passive two-terminal electrical component that stores energy in a magnetic field when electric current flows through it. An inductor typically consists of an insulated wire wound into a coil around a core.

A node is a point on an electrical circuit adjacent to a circuit component, and is often a point between circuit components where a characteristic of the circuit may be identified. A port or a terminal is considered a node of a circuit structure that may provide external access or point of connection with another circuit structure, or represents an end of a component or structure within a circuit.

Two elements are considered "coupled" when they are in such relation that the performance of one element influences the performance of the other by energy transfer by electrical conduction (involving electron flow), electromagnetic induction (such as inductive coupling or capacitive coupling), or electromagnetic radiation. Coupling includes being connected, either permanently or releasably, whether directly or indirectly through intervening components, and is not necessarily limited to physical connection(s). Electromagnetically coupled elements have energy transfer by electromagnetic induction, such as is provided by inductive coupling or capacitive coupling.

Two spaced-apart conductive lines are inductively coupled or electromagnetically coupled when they are spaced closely enough together for energy flowing in one to be induced in the other electromagnetically and/or electrostatically. The amount of energy flowing between the lines is related to the dielectric and magnetic media the conductors are in and the spacing between the lines. Even though electromagnetic fields surrounding the lines are theoretically infinite, lines are often referred to as being closely or tightly coupled, loosely coupled, or uncoupled, based on the relative amount of coupling. The amount of coupling may be defined by a coupling coefficient. However, as a practical measure, two lines may be considered to be inductively coupled when a detectable signal is coupled from one line onto the other. A threshold of coupling may be appropriate to distinguish between coupled and uncoupled lines. In most applications, two lines that have less than 20 dB inductive coupling between them are considered to be uncoupled lines. In some applications, lines that have less than 100 dB are considered to be uncoupled lines. In terms of a coupling coefficient, two lines may be considered to be electromagnetically closely coupled if the coupling coefficient is greater than 0.1. For purposes of the following description, two lines, including inductors that are electromagnetically closely coupled are also referred to as a coupler. Thus, two lines may be considered as loosely coupled or substantially uncoupled if they have a coupling coefficient of less than 0.1.

Two conductors are electrically connected when there is an electron current path between them, including any conductors and electron-conductive electrical elements, such as resistors, and inductors, but not coupling by either electromagnetic induction such as inductive coupling or capacitive coupling, or electromagnetic radiation, such as radio waves and microwave power transmission. Two conductors or other components may be directly electrically connected when there are no intervening electrical elements.

An amplifier that uses balanced or differential input and output connections is less likely to have oscillations caused by input and output signals coupling, and less extraneous noise introduced by the surrounding circuitry. A "balun" is a coupling device that converts an unbalanced source to a balanced one, and vice versa. Sometimes a balun is made with nearly complete isolation between the balanced terminals and ground. Sometimes a balun is made with each balanced terminal referenced to ground, but with equal and opposite voltages appearing at these terminals. These are both valid baluns, but in one case, the unbalanced voltage encounters high impedance to ground, making unbalanced current flow difficult, while in the other, any unbalanced current encounters a short circuit to ground, minimizing the voltage that enters the balanced circuit. Microwave baluns can be either of these types, or even a mixture of the two. In any case, one could connect two equal unbalanced loads to the two balanced terminals, with their ground terminals connected together to ground. Ideally, the unbalanced signal input to the balun would be equally distributed to the two unbalanced loads. Thus, a balun may be used as a power divider or combiner, where the two unbalanced loads or sources connected to the balanced terminals would be operating 180-degrees out of phase.

Two circuits or circuit components are connected electrically in parallel when the end nodes are connected and they have the same voltage applied to them. Two circuits or circuit components are connected electrically in series when they are connected directly or indirectly and are conducting the same current.

Ordinal terms such as "first", "second", and "third" are used to distinguish or identify various members of a group, or the like, in the order they are introduced in a particular context and are not intended to show serial or numerical limitation, or be fixed identifiers for the group members.

Where "a" or "a first" element or the equivalent thereof is recited, such usage includes one or more such elements, neither requiring nor excluding two or more such elements.

EXAMPLES, COMPONENTS, AND ALTERNATIVES

The following sections describe selected aspects of exemplary power samplers, as well as related systems and/or methods. The examples in these sections are intended for illustration and should not be interpreted as limiting the entire scope of the concepts described. Each section may include one or more distinct inventions, and/or contextual or related information, function, and/or structure.

Example 1

Figure 1:
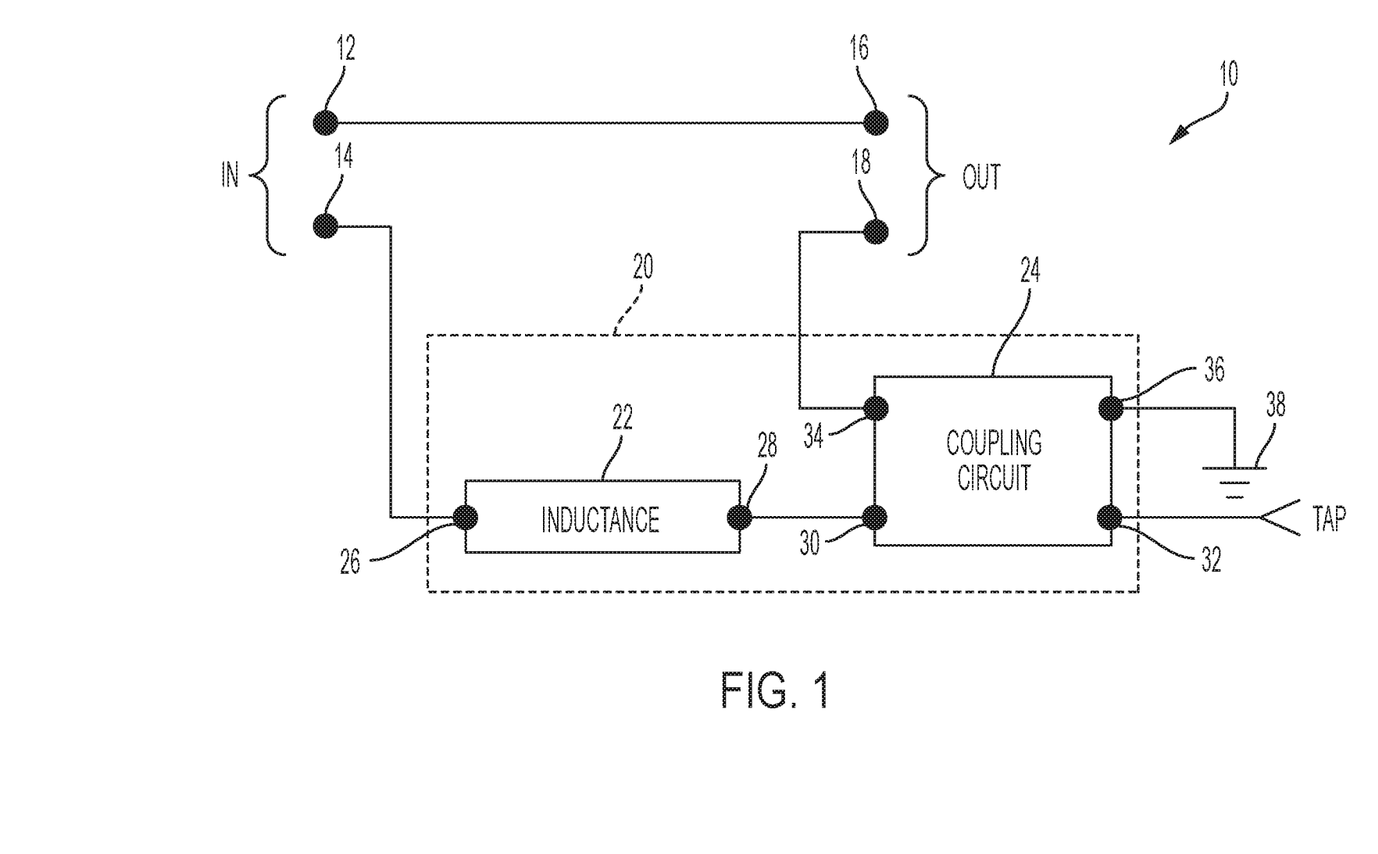
FIG. 1 is a general circuit block diagram showing an example of a power sampler.

FIG. 1 illustrates an illustrative power sampler shown generally at 10 configured to be inserted in differential signal lines. Power sampler 10 includes differential-signal input ports 12, 14, differential-signal output ports 16, 18, and a sampling circuit 20.

Differential-signal input port 12 is configured to receive a first polarity of an input differential signal, such as a positive or non-inverting signal. Differential-signal input port 14 is configured to receive a second polarity of the input differential signal, with the second polarity being opposite the first polarity, such as a negative or inverting signal.

Differential-signal output port 16 is configured to conduct the first polarity of an output differential signal. In this example, the first differential-signal input port is connected to the first differential-signal output port. Differential-signal output port 18 is configured to conduct the second polarity of the output differential signal.

Sampling circuit 20 includes an inductance 22 and a coupling circuit 24. Inductance 22 has an inductance input port 26 and an inductance output port 28. Inductance input port 26 is connected to differential-signal input port 14. Inductance 22 may be any suitable inductive component that provides an inductance impedance (reactance) at a design frequency of operation for the power sampler that is preferably higher than a design source impedance of a differential-signal source (not shown) to which input ports 12, 14 are designed to be connected during use. For example, inductance 22 may be a suitable circuit or device possessing inductive reactance, such as an inductor, transmission line, or inductive voltage transformer.

Coupling circuit 24 has a coupling-circuit input port 30 connected to inductance output port 28, and first and second coupling-circuit output ports 32, 34. Coupling-circuit input port 30 is coupled by coupling circuit 24 to first coupling-circuit output port 32 for outputting a single-ended sample signal having a magnitude proportional to the inductance impedance at the design frequency. Second coupling-circuit output port 34 is connected to differential-signal output port 18, and is coupled by coupling circuit 24 to coupling-circuit input port 30 to conduct the sampled differential signal to differential-signal output port 18. Coupling circuit 24 may be of any suitable configuration that provides the indicated signal coupling, such as a signal tap, balun, or directional coupler. Coupling circuit 24 also preferably includes a ground port 36 connected to a circuit ground 38 providing a reference voltage for the single-ended signal on coupling-circuit output port 32.

Example 2

Figure 2:
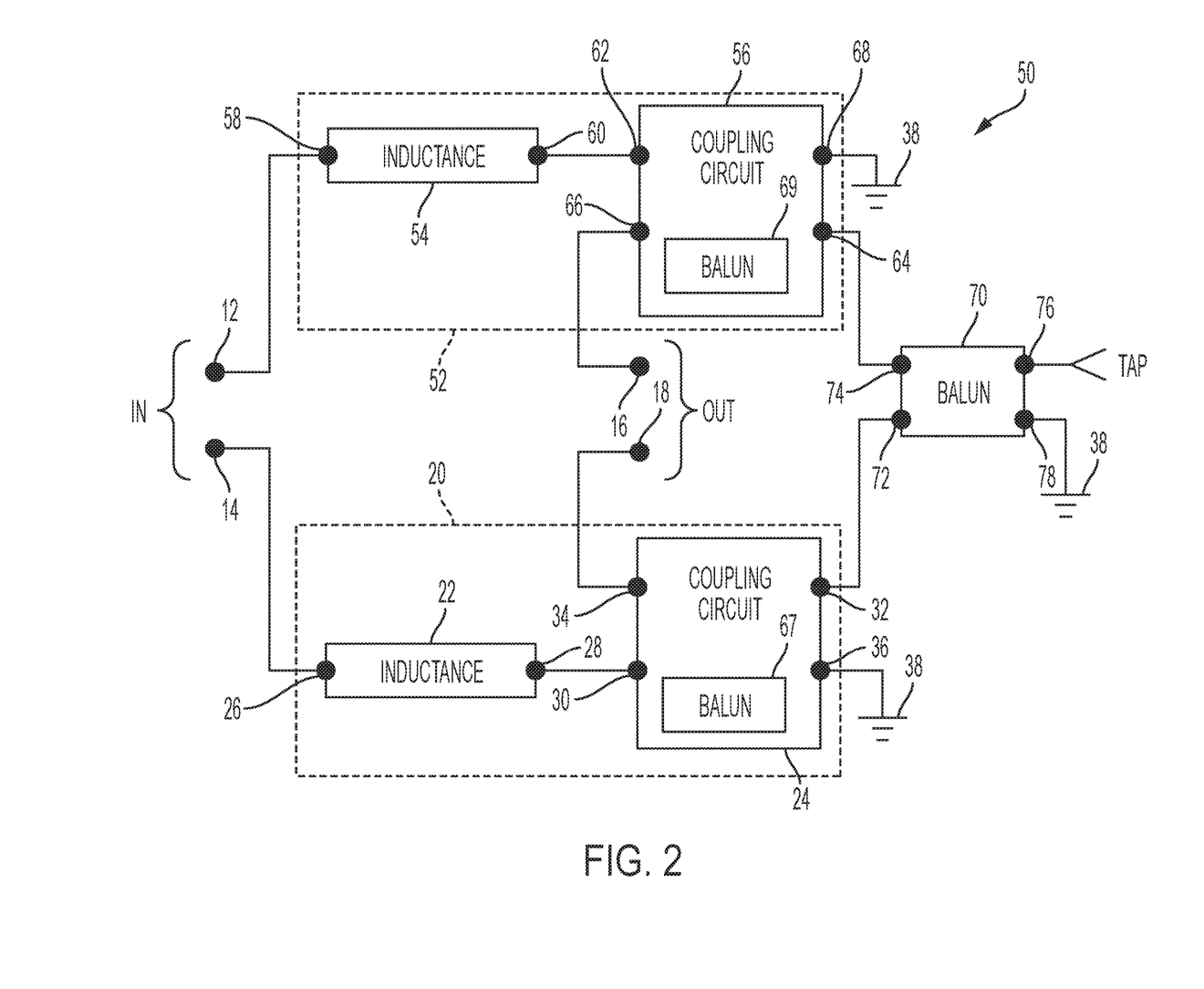
FIG. 2 is a general circuit block diagram showing an example of a power sampler incorporating the power sampler of FIG. 1.

FIG. 2 illustrates another example of a power sampler, shown generally at 50. Power sampler 50 is similar to power sampler 10 in that it includes input and output differential-signal ports 12, 14, 16, 18 and a sampling circuit 20 connected to differential-signal input and output ports 12, 16 and having components as described above for coupling circuit 20.

In addition, power sampler 50 includes a second sampling circuit 52 that is preferably the same as sampling circuit 20 in order to affect the differential signal input on differential-signal input ports 12, 14 equally but with opposite polarities. This assures that a balanced signal received on differential-signal input port undergoes complementary changes by sampling circuits 20, 52, and outputs a balanced signal on differential-signal output ports 16, 18.

Figure 4:
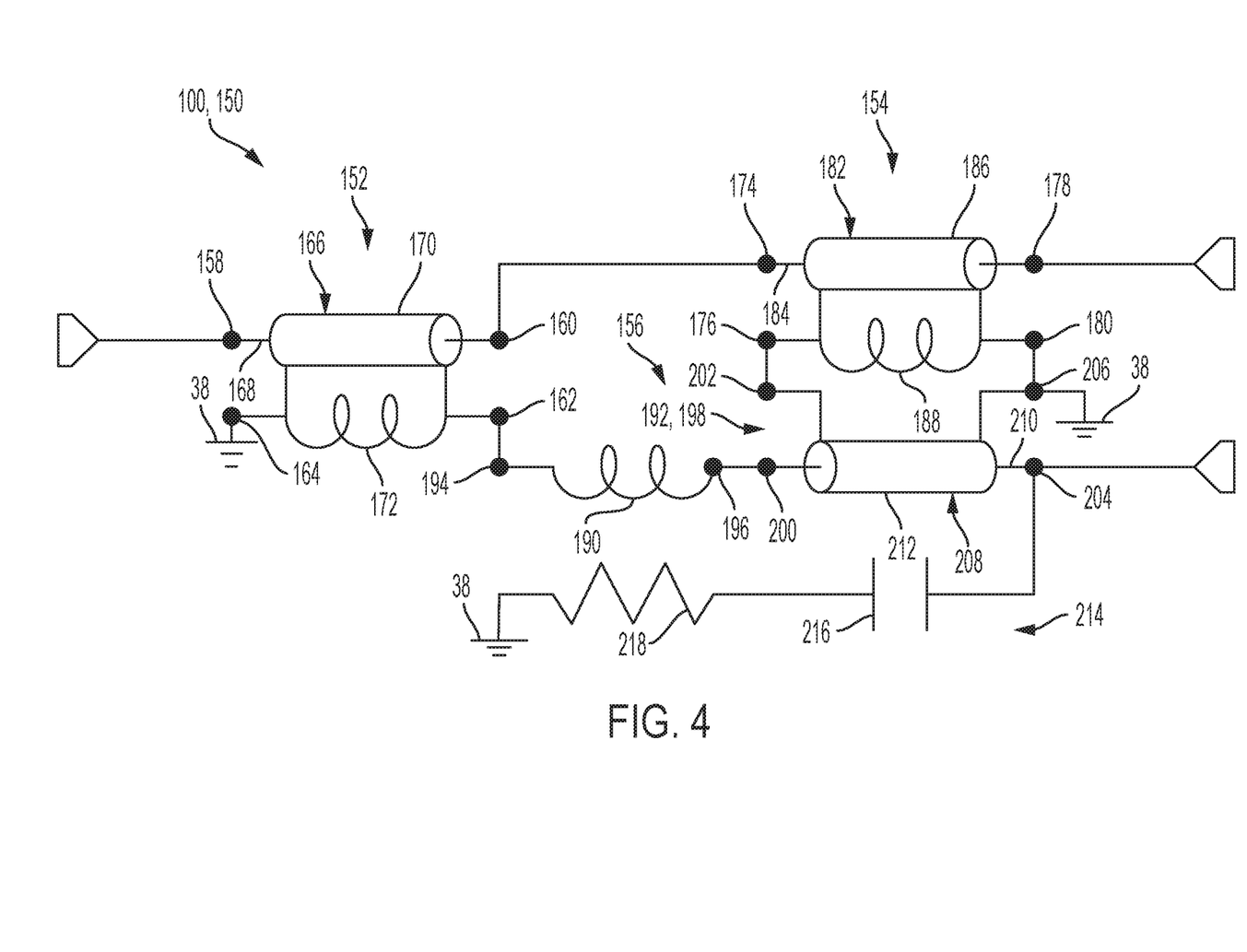
FIG. 4 is a circuit schematic of an embodiment of the power sampler of FIG. 3.
Figure 5:
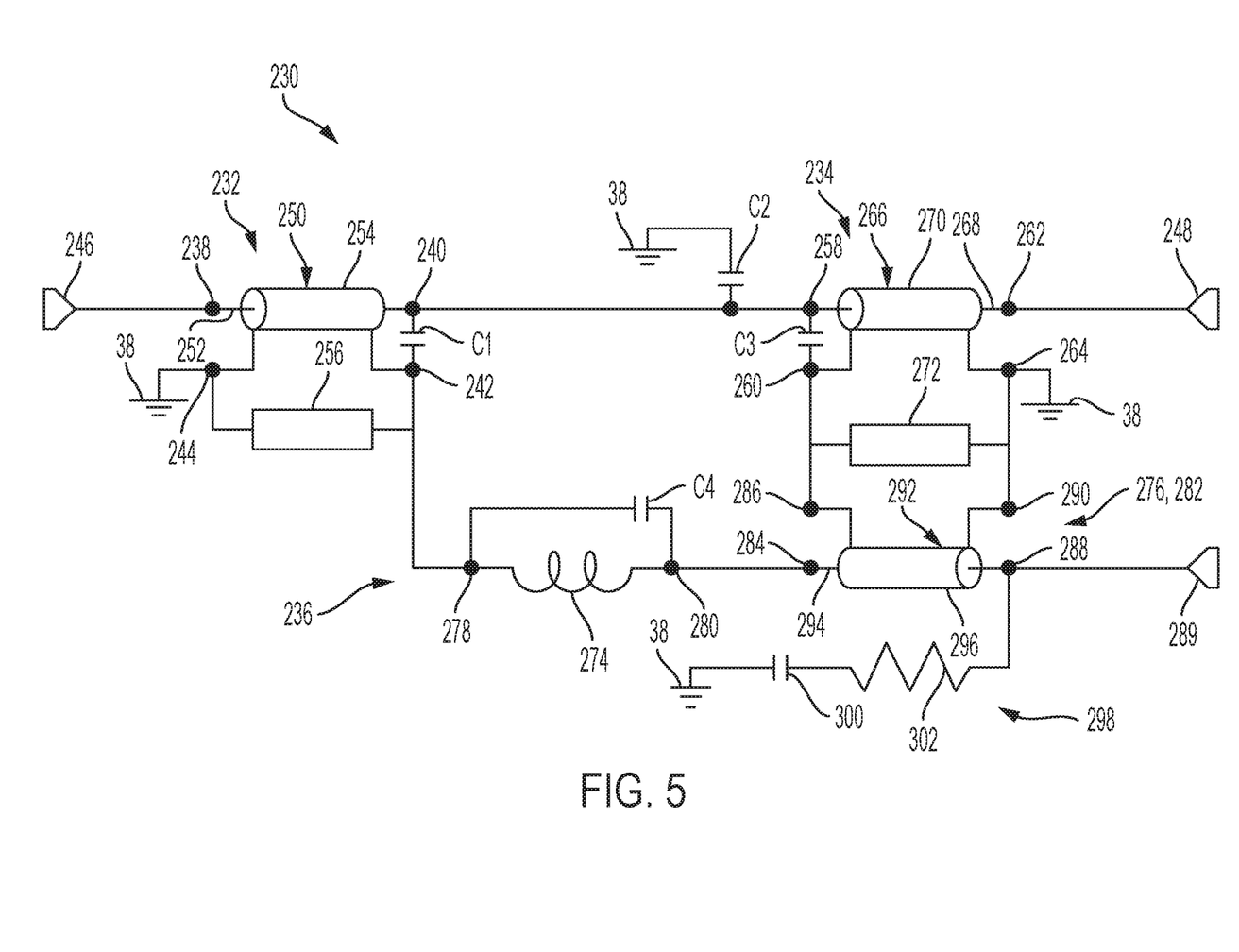
FIG. 5 is a circuit schematic of another embodiment of the power sampler of FIG. 3.

Specifically, sampling circuit 52 includes an inductance 54 and a coupling circuit 56. Inductance 54 has an inductance input port 58 and an inductance output port 60. Inductance input port 58 is connected to differential-signal input port 12. Coupling circuit 56 has a coupling-circuit input port 62 connected to inductance output port 60, and first and second coupling-circuit output ports 64, 66. Coupling-circuit input port 62 is coupled by coupling circuit 56 to first coupling-circuit output port 64 for outputting a single-ended sample signal having a magnitude proportional to the inductance impedance at the design frequency. Second coupling-circuit output port 66 is connected to differential-signal output port 16, and is coupled by coupling circuit 56 to coupling-circuit input port 62 to conduct the sampled differential signal to differential-signal output port 16. Coupling circuit 56 also preferably includes a ground port 68 connected to circuit ground 38 providing a reference voltage for the single-ended signal on coupling-circuit output port 64. As shown, coupling circuit 24 may include a balun 67 and coupling circuit 56 may include a balun 69. Baluns 67, 69 may be configured as described below and as illustrated in FIGS. 3-5.

Separate and complementary sample signals are output on respective coupling-circuit output ports 32, 64. These sample signals may be combined into a single-ended sample or tap signal by a suitable circuit, such as a balun 70. Balun 70 has differential-signal or balanced-signal input ports 72, 74 connected respectively to coupling-circuit output ports 32, 64. A single-ended output port 76 provides the final combined sample or tap signal. The ground reference for the signal on output port 76 is provided by a ground port 78 connected to circuit ground 38.

Example 3

Figure 3:
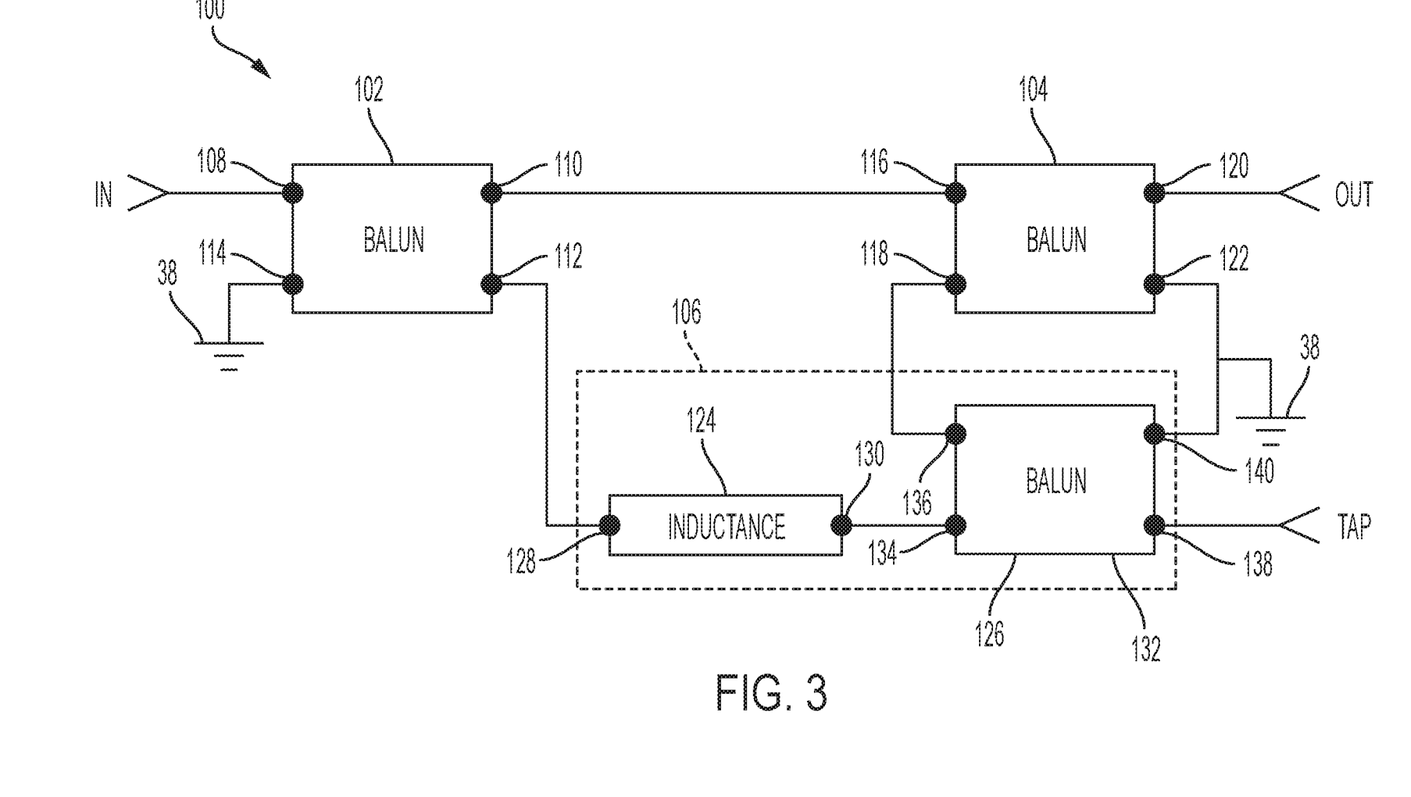
FIG. 3 is a general circuit block diagram showing a further example of a power sampler incorporating the power sampler of FIG. 1.

FIG. 3 illustrates a power sampler, shown generally at 100, that may be used to sample single-ended signals. If complementary differential signals are each referenced to a circuit ground, then power sampler 100 may also be used to sample one of the two complementary differential signals, such as is provided by power sampler 10 illustrated in FIG. 1, or a power sampler 100 may sample both complementary differential signals, similar to power sampler 50 illustrated in FIG. 2.

In the example shown, power sampler 100 includes a first balun 102, a second balun 104, and a sampling circuit 106. Balun 102 is configured to convert a single-ended input signal received on a single-ended-signal input port 108 to a differential input signal on first and second differential-signal input ports 110, 112. A ground port 114 provides a connection to circuit ground 38 as reference for the single-ended signal on port 108. Balun 102 preferably has a balun impedance that matches an impedance of an external single-ended signal source (not shown) having a source impedance.

Balun 104 is configured to convert an output differential signal received on first and second differential-signal output ports 116, 118 to a single-ended output signal on a single-ended-signal output port 120. A ground port 122 provides a connection to circuit ground 38 as reference for the single-ended signal on port 120. In this example, differential-signal input port 110 is directly connected to differential-signal output port 116. The differential signal includes a signal of one polarity, such as positive, on differential-signal ports 110, 116, and a signal of the opposite polarity, such as negative, on differential-signal ports 112, 118. Balun 104 preferably has a balun impedance that matches an impedance of an external single-ended signal load (not shown) having a load impedance. The source impedance and the load impedance may be the same.

Sampling circuit 106 includes an inductance 124 and a coupling circuit 126. Sampling circuit 106 may be connected to either set of differential-signal ports. Inductance 124 may be any suitable circuit or a device possessing inductive reactance, such as an inductor or transmission line. Inductance 124 has an inductance input port 128 connected to differential-signal input port 112, and an inductance output port 130. Inductance 124 preferably has an inductance impedance at a design frequency of operation for the power sampler that is greater than the source and load impedances.

In this example, coupling circuit 126 is a balun 132, which has two coupling-circuit differential-signal input ports 134, 136, a coupling-circuit single-ended output port, 138, and a coupling-circuit ground port 140. Differential-signal input port 134, also referred to as a coupling-circuit or balun input port, is connected to inductance output port 130. Differential-signal input port 136, also referred to as a coupling-circuit output port, is connected to differential-signal output port 118 and coupled by balun 132 to coupling-circuit input port 134. Coupling-circuit output port 138 is coupled by balun 132 to coupling-circuit input port 134 for outputting a single-ended sample signal having a magnitude proportional to the inductance impedance at the design frequency. Thus, by making the inductance impedance and preferably the impedance of balun 132 sufficiently large relative to the impedances of baluns 102, 104 and the source and load impedances, a small sample signal, such as a sample signal less than 20 dB, may be produced. Ground port 140, providing a ground reference for the single-ended sample signal on output port 138, is connected to circuit ground 38.

Example 4

This example is an illustrative power sampler having an inductor and balun in a coupling circuit; see FIG. 4. In this example, a power sampler, shown generally at 150, is an example of power sampler 100. In the example shown, power sampler 150 includes a first balun 152, a second balun 154, and a sampling circuit 156. Balun 152 is configured to convert a single-ended input signal received on a single-ended-signal input port 158 to a differential input signal on first and second differential-signal input ports 160, 162. A ground port 164 provides a connection to circuit ground 38 as reference for the single-ended signal on port 158. Balun 152 preferably has a balun impedance that matches an impedance of an external single-ended signal source (not shown) having a source impedance.

Balun 152 includes a coaxial transmission line 166 having a center conductor 168 and outer or shield conductor 170. Transmission line 166 is preferably a quarter of a wavelength long at a design operating frequency of power sampler 150 ("quarter wavelength"). Balun 152 also includes an inductor 172 connected at opposite ends to corresponding ends of shield conductor 170, so that shield conductor 170 and inductor 172 are connected electrically in parallel, since they have the same voltages applied to them. Inductor 172 thus reduces the inductance of balun 152 by offsetting inductance of shield conductor 170.

Center conductor 168 is connected at one end to single-ended-signal input port 158 and at the other end to differential-signal input port 160. Shield conductor 170 and inductor 172 are connected at respective first ends to ground port 164 and at respective second ends to differential-signal input port 162.

Balun 154 is configured to convert an output differential signal on first and second differential-signal output ports 174, 176 to a single-ended output signal on a single-ended-signal output port 178. A ground port 180 provides a connection to circuit ground 38 as reference for the single-ended signal on port 178. In this example, differential-signal input port 160 is directly connected to differential-signal output port 174. The differential signal includes a signal of one polarity, such as positive, on differential-signal ports 160, 174, and a signal of the opposite polarity, such as negative, on differential-signal ports 162, 176. Balun 154 preferably has a balun impedance that matches an impedance of an external single-ended signal load (not shown) having a load impedance. The source impedance and the load impedance may be the same.

Like balun 152, balun 154 includes a coaxial transmission line 182 having a center conductor 184 and an outer or shield conductor 186, and is preferably a quarter wavelength long. Balun 154 also includes an inductor 188 connected at opposite ends to corresponding ends of shield conductor 186, so that shield conductor 186 and inductor 188 are connected electrically in parallel. Inductor 188 thus reduces the inductance of balun 154 by offsetting inductance of shield conductor 186.

Center conductor 184 is connected at one end to differential-signal output port 174 and at the other end to single-ended-signal input port 178. Shield conductor 186 and inductor 188 are connected at respective first ends to differential-signal output port 176 and at respective second ends to ground port 180.

Sampling circuit 156 can be connected to either set of differential-signal ports. In this example, sampling circuit 156 includes an inductance in the form of an inductor 190 and a coupling circuit 192. Inductor 190 has an inductor input port 194 connected to differential-signal input port 162, and an inductor output port 196. Inductor 190 preferably has an inductor impedance at a design frequency of operation for the power sampler that is greater than the source and load impedances.

In this example, coupling circuit 192 is a balun 198, which has two coupling-circuit differential-signal input ports 200, 202, a coupling-circuit single-ended output port 204, and a coupling-circuit ground port 206. Differential-signal input port 200, also referred to as a coupling-circuit or balun input port, is connected to inductor output port 196. Differential-signal input port 202, also referred to as a coupling-circuit output port, is connected to differential-signal output port 176 and coupled by balun 198 to coupling-circuit input port 200. Coupling-circuit input port 200 is coupled by balun 198 to coupling-circuit output port 204 for outputting a single-ended sample signal having a magnitude proportional to the inductor impedance of inductor 190 and the impedance of coupling circuit 192 at the design frequency. Thus, by making the inductor and coupling circuit impedances sufficiently large relative to the impedances of baluns 152, 154, and the source and load, a small sample signal, such as a sample signal less than 20 dB, may be produced. Ground port 206, providing a ground reference for the single-ended sample signal on output port 204, is connected to circuit ground 38.

Balun 198 includes a coaxial transmission line 208 having a center conductor 210 and an outer or shield conductor 212 and is preferably a quarter-wavelength long. Inductor 188 is shared by balun 154 and balun 198. Inductor 188 is also connected at opposite ends to corresponding ends of shield conductor 212, so that shield conductor 212, shield conductor 186, and inductor 188 are all connected electrically in parallel. Inductor 188 thus also reduces the inductance of balun 198 by offsetting inductance of shield conductor 212.

Center conductor 210 is connected at one end to inductor output port 196 and at the other end to single-ended output port 204, which conducts the sample signal. Shield conductor 212 and inductor 188 are connected at respective first ends to differential-signal input port 202, which in turn is connected to differential-signal output port 176. Respective second ends of shield conductor 212 and inductor 188, along with the corresponding end of coax shield conductor 186, are connected to ground via ground ports 180 and 206.

Power sampler 150 also includes an equalizer 214 shunting single-ended output port 204 to circuit ground 38. Equalizer 214 includes a capacitor 216 connected in series electrically with a resistor 218. The values of capacitor 216 and resistor 218 are selected to adjust the balance between frequency components within the sample signal.

Example 5

This example, shown in FIG. 5, is an illustrative power sampler similar to power sampler 150 and having additional tuning components determined during simulation. In this example, a power sampler, shown generally at 230, is an example of power sampler 100 configured to provide at least a 25 dB signal tap or sample for operation between 50 MHz and 1550 MHz. In the example shown, power sampler 230 includes a first balun 232, a second balun 234, and a sampling circuit 236. Balun 232 is configured to convert a single-ended input signal received on a single-ended-signal input port 238 to a differential input signal on first and second differential-signal input ports 240, 242. A ground port 244 provides a connection to circuit ground 38 as reference for the single-ended signal on port 238. Balun 232 preferably has a balun impedance that matches an impedance of an external single-ended signal source (not shown). In this example, power sampler 230 is configured to be connected at an input port 246 to an external source having a source impedance of 50 ohms via signal input port 238, and to be connected at a main-signal output port 248 to an external load having a load impedance also of 50 ohms. Input ports 246 and 238 may be the same port and output ports 262, 248 by be the same port.

Balun 232 includes a quarter-wavelength coaxial transmission line 250 having a center conductor 252 and outer or shield conductor 254. Coaxial transmission line 250 is a quarter-wavelength long and has an impedance of 56.96 ohms. Balun 232 also includes an inductance in the form of a transmission line 256 connected at opposite ends to corresponding ends of shield conductor 254, so that shield conductor 254 and transmission line 256 are connected electrically in parallel. Transmission line 256 also preferably has a length that is a quarter of a wavelength at a design operating frequency of power sampler 230 and an impedance of 35.63 ohms. Transmission line 256 reduces the inductance of balun 232 by offsetting inductance of shield conductor 254.

Center conductor 252 is connected at one end to single-ended-signal input port 238 that is connected to an external signal source (not shown) at input port 246. The other end of center conductor 252 is connected to differential-signal input port 240. Shield conductor 254 and transmission line 256 are connected at respective first ends to ground port 244 and at respective second ends to differential-signal input port 242. A tuning capacitor C1 of 0.80 pF is connected between differential-signal input ports 240, 242.

Balun 234 is configured to convert an output differential signal on first and second differential-signal output ports 258, 260 to a single-ended output signal on a single-ended-signal output port 262, which is connected to output port 248. Output ports 262 and 248 may be the same port. A ground port 264 provides a connection to circuit ground 38 as reference for the single-ended signal on port 262. In this example, differential-signal input port 240 is directly connected to differential-signal output port 258. A tuning shunt capacitor C2 of 1.20 pF is connected between the connection of differential-signal ports 240, 258 and circuit ground 38.

The differential signal includes a signal of one polarity, such as positive, on differential-signal ports 240, 258, and a signal of the opposite polarity, such as negative, on differential-signal ports 242, 260. Balun 234 preferably has a balun impedance of that matches a load impedance of an external single-ended signal load (not shown). The source impedance and the load impedance are both 50 ohms in this example.

Like balun 232, balun 234 includes a quarter-wavelength coaxial transmission line 266 having a center conductor 268 and an outer or shield conductor 270. Coaxial transmission line 266 preferably has an impedance of 56.96 ohms. Balun 232 also includes a quarter-wavelength transmission line 272 connected at opposite ends to corresponding ends of shield conductor 270, so that shield conductor 270 and transmission line 272 are connected electrically in parallel. Transmission line 272 preferably has an impedance of 35.63 ohms, and reduces the inductance of balun 234 by offsetting inductance of shield conductor 270.

More specifically, center conductor 268 is connected at one end to differential-signal output port 258 and at the other end to single-ended-signal output port 262. Shield conductor 270 and transmission line 272 are connected at respective first ends to differential-signal output port 260 and at respective second ends to ground port 264. A tuning capacitor C3 of 0.80 pF is connected between differential-signal output ports 258, 260.

Sampling circuit 236 can be connected to either set of differential-signal ports, but is preferably connected between differential-signal ports 242, 260 so the sample is taken from the differential signal on shield conductors 254 and 270 of respective coaxial transmission lines 250, 266. Sampling circuit 236 includes an inductance in the form of an inductor 274 and a coupling circuit 276. Inductor 274 has an inductor input port 278 connected to differential-signal input port 242, and an inductor output port 280. Inductor 274 preferably has an inductance of 13.74 nH. Inductor 274 therefore has an inductor impedance that ranges from 4.31 ohms at 50 MHz to 129.43 ohms at 1500 MHz. At a design or mid-range frequency of operation of 850 MHz, the inductance impedance is 73.34 ohms, which is higher than the source and load impedances of 50 ohms and the coax impedances of 56.96 ohms of in-line coaxial transmission lines 250, 266.

A compensating capacitor C4, preferably of 0.50 pF, is also connected between inductor input port 278 and inductor output port 280, making it electrically in parallel with inductor 274. The parallel combination of inductor 274 and capacitor C4 results in a net impedance of 91.16 ohms at 850 MHz and 331 ohms at 1500 MHz.

In this example, coupling circuit 276 is a balun 282, which has two coupling-circuit differential-signal input ports 284, 286, a coupling-circuit single-ended output port 288, and a coupling-circuit ground port 290. Differential-signal input port 284, also referred to as a coupling-circuit or balun input port, is connected to inductor output port 280. Differential-signal input port 286, also referred to as a coupling-circuit output port, is connected to differential-signal output port 260 and coupled by balun 282 to coupling-circuit input port 284. Ground port 290, providing a ground reference for the single-ended sample signal on output port 288, is connected to circuit ground 38.

Coupling-circuit input port 284 is coupled by balun 282 to coupling-circuit output port 288 for outputting a single-ended sample signal having a magnitude proportional to the effective inductor impedance of inductor 274 at the design frequency in combination with the parallel impedance of tuning capacitor C4. Thus, by making the inductor and coupling circuit impedances sufficiently large relative to the impedances of baluns 232, 234, a small sample signal, such as a sample signal less than 20 dB, may be produced.

Balun 282 includes a quarter-wavelength coaxial transmission line 292 having a center conductor 294 and an outer or shield conductor 296. Transmission line 272 is shared by balun 234 and balun 282. Transmission line 272 is also connected at opposite ends to corresponding ends of shield conductor 296, so that shield conductor 296, shield conductor 270, and transmission line 272 are all connected electrically in parallel. Transmission line 272 thus also reduces the inductance of balun 282 by offsetting inductance of shield conductor 296.

Center conductor 294 is connected at one end to inductor output port 280 and at the other end to single-ended sample-signal output port 288. Sample-signal output port 288 is connected to a tap output port 289, which conducts the sample signal to an external sample-signal processing circuit (not shown). Output ports 288 and 289 may be the same port. Shield conductor 296 and transmission line 272 are connected at respective first ends to differential-signal input port 286, which in turn is connected to differential-signal output port 260. Respective second ends of shield conductor 296 and transmission line 272, along with the corresponding end of coax shield conductor 270, are connected to circuit ground 38 via ground ports 264, 290.

Power sampler 230 also includes an equalizer 298 connecting single-ended output port 288 to circuit ground 38. Equalizer 298 includes a capacitor 300 connected in series electrically with a resistor 302. The values of capacitor 300 and resistor 302 are selected to adjust the balance between frequency components within the sample signal. In this example, the capacitor is 330.58 pF and resistor 301 is 12.16 ohms.

Figure 6:
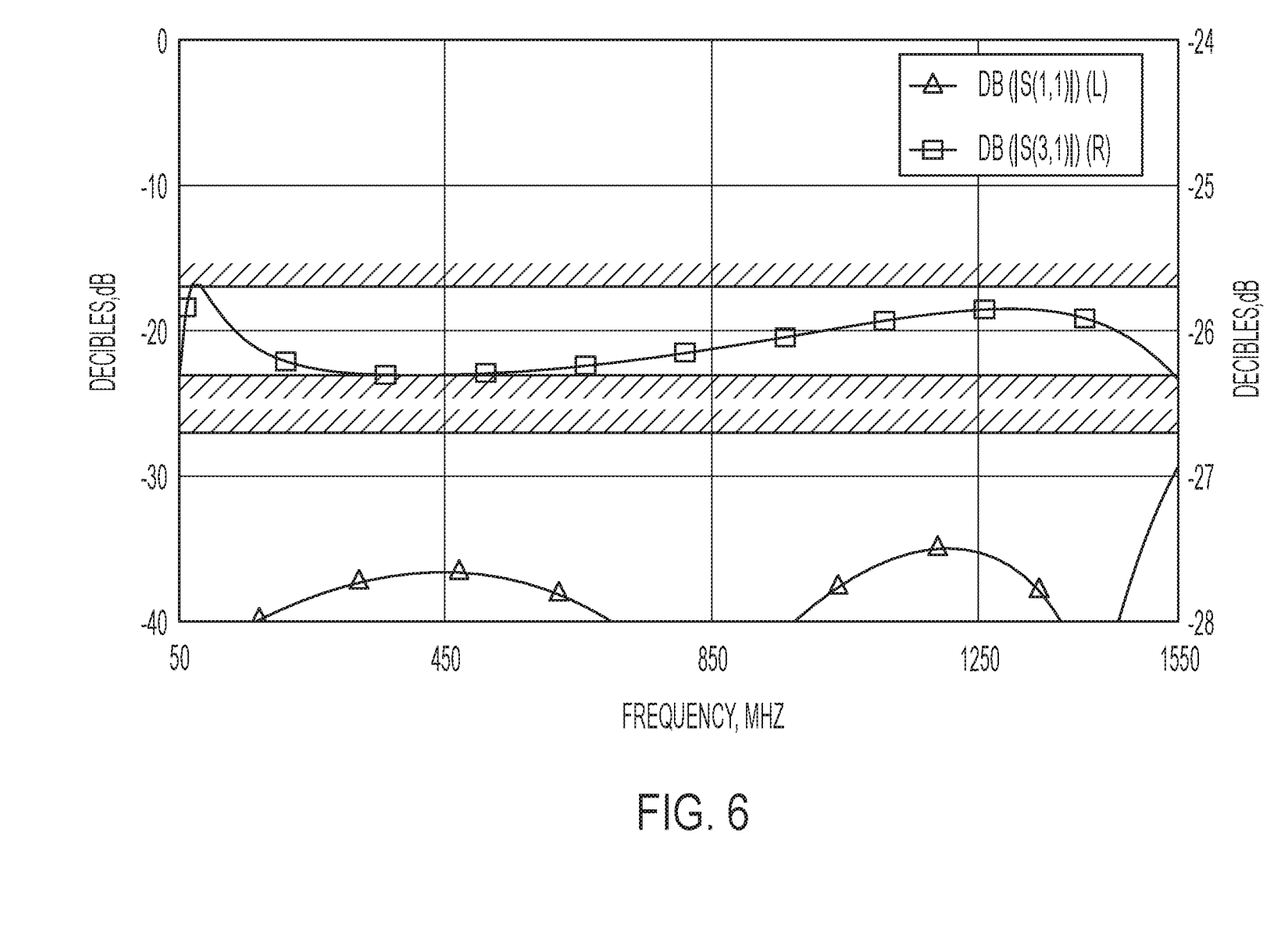
FIG. 6 is a chart showing input return loss and relative level of the power sample.

Simulated operating parameters over a frequency range of 50 MHz to 1550 MHz are illustrated in FIG. 6 for power sampler 230. In FIG. 6, port 246 is port 1 and port 289 is port 3. The input return loss (S11) at port 246 is seen to be below −30 dB for the frequency range shown, and is below −35 dB for all but the upper end of the frequency range. The insertion loss (S31) to sample signal output port 289 is below about −25.5 dB over the frequency range.

ADDITIONAL EXAMPLES

This section describes additional aspects and features of power samplers, presented without limitation as a series of paragraphs, some or all of which may be numerically designated for clarity and efficiency. Features mentioned in each of these paragraphs can be combined with features mentioned in one or more other paragraphs, and/or with features mentioned in the description above, in any suitable manner. Some of the paragraphs below expressly refer to and further limit other paragraphs, providing without limitation examples of some of the suitable combinations.

1. A power sampler may include a first differential-signal input port configured to receive a first polarity of an input differential signal; a first differential-signal output port configured to conduct the first polarity of an output differential signal; wherein the first differential-signal input port is connected to the first differential-signal output port; a second differential-signal input port configured to receive a second polarity of the input differential signal, wherein the second polarity is opposite the first polarity, a second differential-signal output port configured to conduct the second polarity of the output differential signal; and a first sampling circuit including an inductance having an inductance input port and an inductance output port, wherein the inductance input port is connected to the second differential-signal input port and the inductance has an inductance impedance at a design frequency of operation for the power sampler; and a coupling circuit having a coupling-circuit input port connected to the inductance output port, a first coupling-circuit output port coupled to the coupling-circuit input port for outputting a single-ended sample signal having a magnitude proportional to the inductance impedance at the design frequency, and a second coupling-circuit output port connected to the second differential-signal output port and coupled to the coupling-circuit input port.

2. The power sampler of paragraph 1, wherein the first polarity is positive and the second polarity is negative.

3. The power sampler of paragraph 1, wherein the power sampler is configured to be connected at the first and second differential-signal input ports to a source having a source impedance, and the inductance impedance is higher than the source impedance at the design frequency.

4. The power-sampler of paragraph 3 may further include a balun configured to convert a single-ended input signal received on a single-ended-signal input port to the input differential signal on the first and second differential-signal-input ports, wherein the balun has a balun impedance that is higher than the source impedance at the design frequency.

5. The power sampler of paragraph 1, wherein the power sampler is configured to be connected at the first and second differential-signal-output ports to a load having a load impedance, and the coupling circuit has a coupling-circuit impedance that is higher than the load impedance at the design frequency.

6. The power sampler of paragraph 5 may further include a first balun connected to the first and second differential-signal-output ports and configured to convert a differential input signal received on the first and second differential-signal-output ports to an output single-ended signal on a single-ended-signal output port, wherein the first balun has a balun impedance that is higher than the load impedance at the design frequency.

7. The power sampler of paragraph 6, wherein the coupling circuit includes a second balun configured to convert a differential input signal received on the coupling-circuit input port and the second coupling-circuit output port to the single-ended sample signal on the first coupling-circuit output port, and the second balun has the coupling-circuit impedance at the design frequency.

8. The power sampler of paragraph 7, wherein the inductance impedance is higher than the load impedance at the design frequency.

9. The power sampler of paragraph 1, wherein the coupling circuit includes a balun configured to convert a differential input signal received on the coupling-circuit input port and the second coupling-circuit output port to the single-ended sample signal on the first coupling-circuit output port.

10. The power sampler of paragraph 9, wherein the power sampler is configured to be connected at the first and second differential-signal-output ports to a load having a load impedance, and the balun has an impedance that is higher than the load impedance at the design frequency.

11. The power sampler of paragraph 1 may further include a first balun configured to convert a single-ended input signal received on a single-ended-signal input port to the differential input signal on the first and second differential-signal input ports; and a second balun configured to convert the output differential signal on the first and second differential-signal output ports to a single-ended output signal on a single-ended-signal output port.

12. The power sampler of paragraph 11, wherein the first polarity is positive and the second polarity is negative.

13. The power sampler of paragraph 11, wherein the first balun has a first impedance, and the inductance impedance is higher than the first impedance at the design frequency.

14. The power sampler of paragraph 11, wherein the second balun has a first impedance, and the coupling circuit has a coupling-circuit impedance that is higher than the first impedance at the design frequency.

15. The power sampler of paragraph 14, wherein the coupling circuit includes a third balun configured to convert a differential input signal received on the coupling-circuit input port and the second coupling-circuit output port to the single-ended sample signal on the first coupling-circuit output port, and the third balun has the coupling-circuit impedance at the design frequency.

16. The power sampler of paragraph 15, wherein the inductance impedance is higher than the first impedance at the design frequency.

17. The power sampler of paragraph 1 may further include a second sampling circuit that is the same as the first sampling circuit, wherein the first differential-signal input port is connected to the first differential-signal output port through the second sampling circuit, the inductance input port of the inductance of the second sampling circuit is connected to the first differential-signal input port, the coupling-circuit input port of the coupling circuit of the second sampling circuit is connected to the inductance output port of the inductance of the second sampling circuit, the first coupling-circuit output port of the coupling circuit of the second sampling circuit is coupled to the coupling-circuit input port for outputting a second single-ended sample signal having a magnitude proportional to the inductance impedance of the inductance of the second sampling circuit, and the second coupling-circuit output port of the coupling circuit of the second sampling circuit is connected to the first differential-signal output port and coupled to the coupling-circuit input port of the coupling circuit of the second sampling circuit.

18. The power sampler of paragraph 17, wherein the power sampler is configured to be connected at the first and second differential-signal-output ports to a load having a load impedance, the coupling circuits of the first and second sampling circuits each include a balun configured to convert a differential input signal received on the respective coupling-circuit input port and the respective second coupling-circuit output port to the respective single-ended sample signal on the respective first coupling-circuit output port.

19. The power sampler of paragraph 18, wherein each balun of the coupling circuits of the first and second sampling circuits has an impedance that is higher than the load impedance at the design frequency.

20. The power sampler of paragraph 18 may further include a third balun configured to convert the single-ended sample signals of the baluns of the first and second power sampling circuits to a single-ended combined-sample signal.

ADVANTAGES, FEATURES, BENEFITS

The different embodiments of the power sampler described herein provide several advantages over known solutions for tapping a main signal to produce a sample signal of consistent level over a broad frequency range. For example, the illustrative embodiments of power samplers described herein allow tapping a signal over a broad frequency range using one of a pair of differential signals. Additionally, and among other benefits, illustrative embodiments of the power samplers described herein can be applied to either a single-ended signal circuit or a differential-signal circuit. Thus, the illustrative embodiments described herein are particularly useful for sampling power of signals having a broad frequency range. However, not all embodiments described herein provide the same advantages or the same degree of advantage.

CONCLUSION

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to one of the same inventions, and whether broader, narrower, equal, or different in scope to the original claims, also are regarded as included within the subject matter of the invention(s) described herein.

The invention claimed is:

1. A power sampler comprising:
  a first differential-signal input port configured to receive a first polarity of an input differential signal;
  a first differential-signal output port configured to conduct the first polarity of an output differential signal; wherein the first differential-signal input port is connected to the first differential-signal output port;
  a second differential-signal input port configured to receive a second polarity of the input differential signal, wherein the second polarity is opposite the first polarity, a second differential-signal output port configured to conduct the second polarity of the output differential signal; and a first sampling circuit including:

an inductance having an inductance input port and an inductance output port, wherein the inductance input port is connected to the second differential-signal input port and the inductance has an inductance impedance at a design frequency of operation for the power sampler; and a coupling circuit having a coupling-circuit input port connected to the inductance output port, a first coupling-circuit output port coupled to the coupling-circuit input port for outputting a single-ended sample signal having a magnitude proportional to the inductance impedance at the design frequency, and a second coupling-circuit output port connected to the second differential-signal output port and coupled to the coupling-circuit input port.

2. The power sampler of claim 1, wherein the first polarity is positive and the second polarity is negative.

3. The power sampler of claim 1, wherein the power sampler is configured to be connected at the first and second differential-signal input ports to a source having a source impedance, and the inductance impedance is higher than the source impedance at the design frequency.

4. The power-sampler of claim 3, further comprising a balun configured to convert a single-ended input signal received on a single-ended-signal input port to the input differential signal on the first and second differential-signal-input ports, wherein the balun has a balun impedance that is higher than the source impedance at the design frequency.

5. The power sampler of claim 1, wherein the power sampler is configured to be connected at the first and second differential-signal-output ports to a load having a load impedance, and the coupling circuit has a coupling-circuit impedance that is higher than the load impedance at the design frequency.

6. The power sampler of claim 5, further comprising a first balun connected to the first and second differential-signal-output ports and configured to convert a differential input signal received on the first and second differential-signal-output ports to an output single-ended signal on a single-ended-signal output port, wherein the first balun has a balun impedance that is higher than the load impedance at the design frequency.

7. The power sampler of claim 6, wherein the coupling circuit includes a second balun configured to convert a differential input signal received on the coupling-circuit input port and the second coupling-circuit output port to the single-ended sample signal on the first coupling-circuit output port, and the second balun has the coupling-circuit impedance at the design frequency.

8. The power sampler of claim 7, wherein the inductance impedance is higher than the load impedance at the design frequency.

9. The power sampler of claim 1, wherein the coupling circuit includes a balun configured to convert a differential input signal received on the coupling-circuit input port and the second coupling-circuit output port to the single-ended sample signal on the first coupling-circuit output port.

10. The power sampler of claim 9, wherein the power sampler is configured to be connected at the first and second differential-signal-output ports to a load having a load impedance, and the balun has an impedance that is higher than the load impedance at the design frequency.

11. The power sampler of claim 1, further comprising:

a first balun configured to convert a single-ended input signal received on a single-ended-signal input port to the differential input signal on the first and second differential-signal input ports; and a second balun configured to convert the output differential signal on the first and second differential-signal output ports to a single-ended output signal on a single-ended-signal output port.

12. The power sampler of claim 11, wherein the first polarity is positive and the second polarity is negative.

13. The power sampler of claim 11, wherein the first balun has a first impedance, and the inductance impedance is higher than the first impedance at the design frequency.

14. The power sampler of claim 11, wherein the second balun has a first impedance, and the coupling circuit has a coupling-circuit impedance that is higher than the first impedance at the design frequency.

15. The power sampler of claim 14, wherein the coupling circuit includes a third balun configured to convert a differential input signal received on the coupling-circuit input port and the second coupling-circuit output port to the single-ended sample signal on the first coupling-circuit output port, and the third balun has the coupling-circuit impedance at the design frequency.

16. The power sampler of claim 15, wherein the inductance impedance is higher than the first impedance at the design frequency.

17. The power sampler of claim 1, further comprising a second sampling circuit that is the same as the first sampling circuit, wherein the first differential-signal input port is connected to the first differential-signal output port through the second sampling circuit, the inductance input port of the inductance of the second sampling circuit is connected to the first differential-signal input port, the coupling-circuit input port of the coupling circuit of the second sampling circuit is connected to the inductance output port of the inductance of the second sampling circuit, the first coupling-circuit output port of the coupling circuit of the second sampling circuit is coupled to the coupling-circuit input port for outputting a second single-ended sample signal having a magnitude proportional to the inductance impedance of the inductance of the second sampling circuit, and the second coupling-circuit output port of the coupling circuit of the second sampling circuit is connected to the first differential-signal output port and coupled to the coupling-circuit input port of the coupling circuit of the second sampling circuit.

18. The power sampler of claim 17, wherein the power sampler is configured to be connected at the first and second differential-signal-output ports to a load having a load impedance, the coupling circuits of the first and second sampling circuits each include a balun configured to convert a differential input signal received on the respective coupling-circuit input port and the respective second coupling-circuit output port to the respective single-ended sample signal on the respective first coupling-circuit output port.

19. The power sampler of claim 18, wherein each balun of the coupling circuits of the first and second sampling circuits has an impedance that is higher than the load impedance at the design frequency.

20. The power sampler of claim 18, further comprising a third balun configured to convert the single-ended sample signals of the baluns of the first and second power sampling circuits to a single-ended combined-sample signal.

* * * * *